United States Patent
Taniguchi

(10) Patent No.: US 6,549,100 B2
(45) Date of Patent: Apr. 15, 2003

(54) SURFACE ACOUSTIC WAVE LATTICE FILTER WITH DIFFERENT LATTICE AND SERIES ARM CAPACITANCE RATIOS AND COMMUNICATION DEVICE USING SAME

(75) Inventor: Norio Taniguchi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 149 days.

(21) Appl. No.: 09/778,180

(22) Filed: Feb. 7, 2001

(65) Prior Publication Data

US 2001/0012237 A1 Aug. 9, 2001

(30) Foreign Application Priority Data

Feb. 7, 2000  (JP) ......................................... 2000-029244

(51) Int. Cl.[7] ................................................ H03H 9/64
(52) U.S. Cl. ....................................... 333/193; 333/133
(58) Field of Search .............................. 333/193–196, 333/190, 133

(56) References Cited

U.S. PATENT DOCUMENTS

| | | | | |
|---|---|---|---|---|
| 2,216,937 A | * | 10/1940 | Ciccolella | ................... 333/190 |
| 2,929,031 A | * | 3/1960 | Kosowsky | ................... 333/190 |
| 5,847,626 A | * | 12/1998 | Taguchi et al. | ............. 333/193 |
| 5,933,062 A | * | 8/1999 | Kommrusch | ................ 333/193 |
| 6,018,281 A | * | 1/2000 | Taguchi et al. | ............. 333/193 |

FOREIGN PATENT DOCUMENTS

| | | |
|---|---|---|
| EP | 0 668 655 A1 | 8/1995 |
| JP | 7-288442 | 10/1995 |
| JP | 9-289434 | 11/1997 |
| JP | 11-112284 | * 4/1999 |
| WO | WO 99/29039 | 6/1999 |

* cited by examiner

*Primary Examiner*—Barbara Summons
(74) *Attorney, Agent, or Firm*—Keating & Bennett, LLP

(57) ABSTRACT

A surface acoustic wave filter includes a piezoelectric substrate and a plurality of surface acoustic wave resonators mounted on the piezoelectric substrate. The plurality of surface acoustic wave resonators are connected so as to constitute a lattice-type circuit having series-arm resonators and lattice-arm resonators, and a capacitance ratio γ value of the lattice-arm resonators and a capacitance ratio γ value of the series-arm resonators are made different from each other.

22 Claims, 14 Drawing Sheets

SURFACE ACOUSTIC WAVE LATTICE FILTER WITH DIFFERENT LATTICE AND SERIES ARM CAPACITANCE RATIOS AND COMMUNICATION DEVICE USING SAME

BACKGROUND OF THE INVENTION

1. Field of the Invention

The present invention relates to a surface acoustic wave filter in which a plurality of surface acoustic wave resonators are mounted on a single piezoelectric substrate and more particularly, the present invention relates to a surface acoustic wave filter having a lattice-type circuit construction.

2. Description of the Related Art

Various surface acoustic wave filters have been proposed to function as a bandpass filter. Among these surface acoustic wave filters, a surface acoustic wave filter that is constructed to deal with balanced input and output has a lattice-type circuit construction.

FIG. 16 shows the circuit diagram of a surface acoustic wave filter of a lattice-type circuit construction. In the surface acoustic wave filter shown in FIG. 16, between a signal terminal 101 and a signal terminal 102, one series arm is constructed and a series-arm resonator 103 defining a series arm is connected thereto. Furthermore, also between a signal terminal 104 and a signal terminal 105, another series arm is constructed and a series-arm resonator 106 defining a series arm is connected thereto.

Furthermore, between the signal terminal 101 and the signal terminal 105, a lattice arm is constructed and a lattice-arm resonator 107 defining a lattice arm is connected thereto. Furthermore, also between the signal terminal 104 and the signal terminal 102, a lattice arm is constructed and a lattice-arm resonator 108 is connected to define the lattice arm.

In the above-described surface acoustic wave filter, any of the series-arm resonators 103 and 106 and the lattice-arm resonators 107 and 108 may be composed of a surface acoustic wave resonator having a pair of terminals. That is, as shown in FIG. 17, the surface acoustic wave resonator having a pair of terminals contains an IDT electrode 109 disposed in the middle in the propagation direction of a surface acoustic wave and reflectors 110a and 110b disposed on both sides of the IDT electrode 109 in the surface wave propagation direction.

One example of filtering characteristics of the above surface acoustic wave filter is shown in FIG. 18.

In Japanese Unexamined Patent Application Publication No. 7-288442, by making the resonant frequency of series-arm resonators substantially agree with the antiresonant frequency of lattice-arm resonators in a surface acoustic wave filter of a lattice-type circuit as described above, it is understood that a filtering characteristic as shown in FIG. 19 can be obtained. That is, it is understood that the bandwidth can be expanded and that the steepness of attenuation characteristics can be increased in the vicinity of the passband.

On the other hand, Japanese Unexamined Patent Application Publication No. 9-289434 discloses a surface acoustic wave filter where a plurality of stages of surface acoustic wave filters having a lattice-type circuit construction are cascaded and where the capacitance ratio between a series arm and a parallel arm at each stage is made different. Here, it is understood that, because of the above-described construction, the steepness of filtering characteristics is increased in the vicinity of the passband and a high attenuation value can be obtained in the frequency region spaced away from the passband. For example, when a surface acoustic wave filter of a two-stage construction is considered, by making the capacitance ratio between the series-arm resonator and the lattice-arm resonator equal in a first stage, a filtering characteristic as shown in FIG. 18 can be obtained. Furthermore, in a second-stage filter, by making the capacitance ratio between the series-arm resonator and the lattice-arm resonator 1:2, a filtering characteristic as shown in FIG. 19 can be obtained. Therefore, by combining these filtering characteristics, it is understood that the attenuation value as a whole becomes high and the steepness in the vicinity of the passband can be increased.

In the surface acoustic wave filter described in Japanese Unexamined Patent Application Publication No. 7-288442, when attempts were made to obtain a high attenuation value at frequencies away from the passband, there was a problem that the steepness of filtering characteristics is reduced in the vicinity of the passband. As a lattice-type circuit constitutes a bridge circuit, when the capacitance of a series-arm resonator is represented by Z1 and the capacitance of a lattice-arm resonator is represented by Z2 and only when the balance condition of Z1=Z2 is met, the output signal becomes zero and an attenuation pole is caused. Therefore, when attempts are made to achieve an attenuation value at frequencies away from the passband high, the closer to 1:1 the ratio between the electrode capacitance Z1 of the lattice-arm resonator and the electrode capacitance Z2 of the series-arm resonator, the more desirable.

However, when the ratio of electrode capacitance between the lattice-arm resonator and the series-arm resonator is made 1:1, like the filtering characteristic shown in FIG. 18, there was a problem that no attenuation pole is produced in the vicinity of the passband and that the steepness is deteriorated around the passband.

On the other hand, as described in Japanese Unexamined Patent Application Publication No. 7-288442, when the ratio of electrode capacitance between the lattice-arm resonator and the series-arm resonator is changed from 1:1, like the filtering characteristic shown in FIG. 19, attenuation poles are produced around the passband and the steepness of filtering characteristics is improved. However, in this case, there was a problem that the attenuation value becomes low at frequencies away from the passband.

In the prior art described in Japanese Unexamined Patent Application Publication No. 9-289434, although the above problem is solved, because of a plurality of stages of surface acoustic wave filters of a lattice-type circuit construction are cascaded, the whole device including all of the surface acoustic wave filters becomes very large. Furthermore, because of the construction where a plurality of stages are connected, there was a problem that loss increases in the passband.

SUMMARY OF THE INVENTION

In order to overcome the problems described above, preferred embodiments of the present invention provide a surface acoustic wave filter having a lattice-type circuit construction that solves the above-mentioned problems with the prior art, the chip size is not increased to be a large size, loss in the passband is prevented from increasing, and the steepness in filtering characteristics is superior.

The surface acoustic wave filter according to a preferred embodiment of the present invention includes a piezoelectric substrate and a plurality of surface acoustic wave resonators mounted on the piezoelectric substrate. The plurality of surface acoustic wave resonators are connected so as to constitute a lattice-type circuit having series-arm resonators and lattice-arm resonators. Each capacitance ratio γ value of the lattice-arm resonator and the series-arm resonator is different from each other.

In another preferred embodiment of the present invention, parallel capacitors are added to at least either of the lattice-arm resonators and the series-arm resonators so that the γ values of the lattice-arm resonator and the series-arm resonator are made different from each other.

In another preferred embodiment of the present invention, IDT electrodes are provided and arranged such that in at least either of the lattice-arm resonators and the series-arm resonators, withdrawal weighting is performed so that the γ values of the lattice-arm resonator and the series-arm resonator are different from each other.

In another preferred embodiment of the present invention, the difference in electrode capacitance between the series-arm resonator and the lattice-arm resonator including an external element connected to each resonator is preferably within about ±10% of the electrode capacitance of the lattice-arm resonator.

In a surface acoustic wave filter according to preferred embodiments of the present invention, because a lattice-type circuit construction is used and the γ value of lattice arms is different from the γ value of series arms, the steepness of filtering characteristics is greatly increased in the vicinity of the passband. For example, when the γ value of lattice arms is higher than the γ value of series arms, the steepness of filtering characteristics is significantly increased on the lower frequency side of the passband, and when the γ value of series arms is higher than the γ value of lattice arms, the steepness of filtering characteristics is significantly increased on the higher frequency side of the passband.

Furthermore, in preferred embodiments of the present invention, since the steepness of filtering characteristics can be increased by only controlling the γ value of the lattice arms and series arms, it is not necessary to use an arrangement having a plurality of stages. Therefore, it is possible to avoid larger chip sizes and increased losses in the passband.

Consequently, according to preferred embodiments of the present invention, it is possible to provide a surface acoustic wave filter which has a very small size, a very small insertion loss, and excellent steepness of filtering characteristics.

Furthermore, it is possible to make the attenuation value high enough in the frequency region away from the passband.

In preferred embodiments of the present invention, when parallel capacitors are added to at least either lattice-arm resonators or series-arm resonators, it is possible to make the γ value of the resonators having capacitors added thereto different from the γ value of the resonators having no capacitors added thereto and to increase the steepness of filtering characteristics according to preferred embodiments of the present invention.

Furthermore, in preferred embodiments of the present invention, when the electrode fingers of at least either of the IDT electrodes of lattice-arm resonators and the series-arm resonators are thinned out, as the γ value is made different from the other by the withdrawal weighting, the steepness of filtering characteristics can be increased according to preferred embodiments of the present invention.

Moreover, in preferred embodiments of the present invention, when the difference between the electrode capacitance of lattice-arm resonators and the electrode capacitance of series-arm resonators is within about ±10% and is more preferably within about ±5% of the electrode capacitance of the lattice-arm resonators, because the electrode capacitances of both resonators are close in value to each other, the attenuation value can be made high enough in the frequency region away from the passband.

Other features, characteristics, advantages and elements of the present invention will become more apparent from the following detailed description of preferred embodiments of the present invention with reference to the attached drawings.

For the purpose of illustrating the present invention, there is shown in the drawings several forms which are presently preferred, it being understood, however, that the present invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
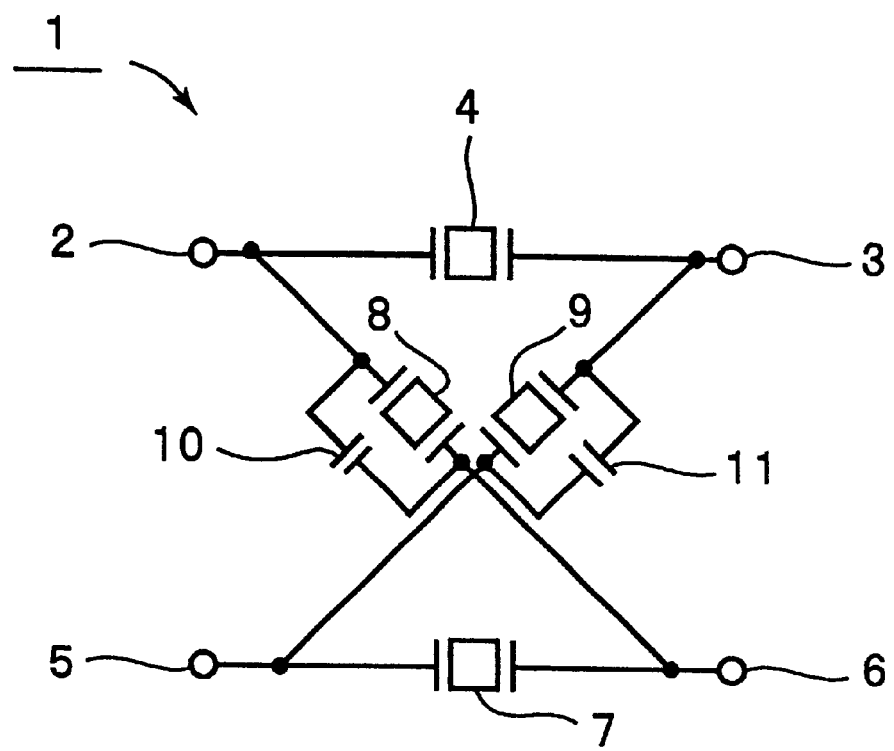
FIG. 1 shows the circuit construction of a surface acoustic wave filter according to a first preferred embodiment of the present invention.

FIG. 1 shows the circuit construction of a surface acoustic wave filter according to a first preferred embodiment of the present invention. In the surface acoustic wave filter 1 of this preferred embodiment of the present invention, a series-arm resonator 4 is connected between a signal terminal 2 and a signal terminal 3. Furthermore, a series-arm resonator 7 is connected between a signal terminal 5 and a signal terminal 6.

That is, a series arm is provided between the signal terminal 2 and the signal terminal 3, and another series arm is provided between the signal terminal 5 and the signal terminal 6 as described above.

Furthermore, a lattice-arm resonator 8 is connected between the signal terminal 2 and the signal terminal 6, and a lattice-arm resonator 9 is connected between the signal terminal 5 and the signal terminal 3. As described above, a first-lattice arm is provided between the signal terminal 2 and the signal terminal 6, and a second lattice arm is provided between the signal terminal 5 and the signal terminal 3.

Furthermore, capacitors 10 and 11 are arranged substantially parallel to the first and second lattice-arm resonators 8 and 9 and are connected in the present preferred embodiment although they are not necessarily required in the present invention.

Next, with reference to FIGS. 2 to 9, it is described that the steepness of filtering characteristics in the vicinity of the passband is increased in the surface acoustic wave filter 1 having a lattice-type circuit construction according to the present preferred embodiment.

Figure 2:
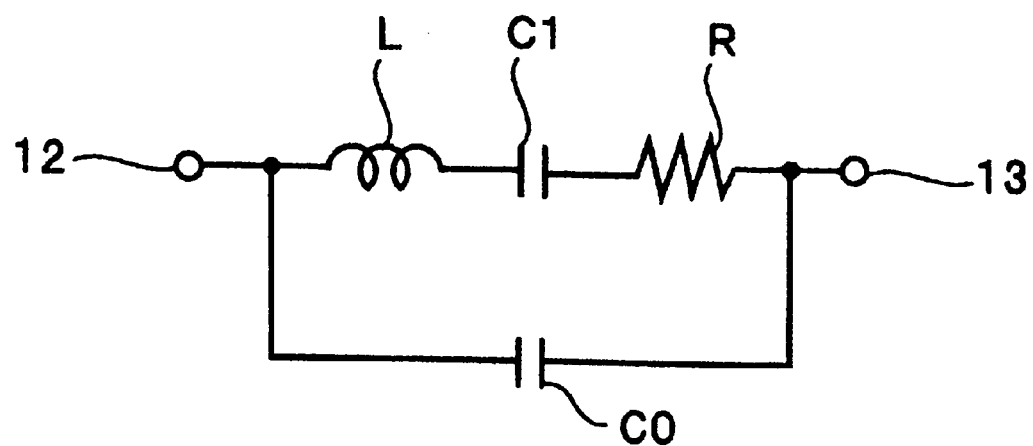
FIG. 2 shows an equivalent circuit of a surface acoustic wave resonator including a pair of terminals.

The equivalent circuit of a resonator is generally shown as in FIG. 2. That is, between an input terminal 12 and an output terminal 13, an inductor, represented by inductance L, a capacitor, represented by capacitance $C_1$, and a resistor, represented by resistance R, are connected in series, and a parallel capacitor of capacitance $C_0$ is connected to the inductor, capacitor, and resistor.

The ratio of the capacitance $C_0$ to the capacitance $C_1$ in the equivalent circuit is a $\gamma$ value, that is, a capacitance ratio.

$$\gamma = C_0/C_1$$

The above $\gamma$ value is one of parameters showing resonance characteristics. The above $\gamma$ value reversely correlates with the frequency difference $\Delta f = f_a - f_b$ between a resonant frequency $f_r$ and an antiresonant frequency $f_a$. That is, the higher the $\gamma$ value is, the smaller the frequency difference $\Delta f$ is, and the lower the $\gamma$ value becomes, the larger the frequency difference $\Delta f$ becomes.

Figure 3:
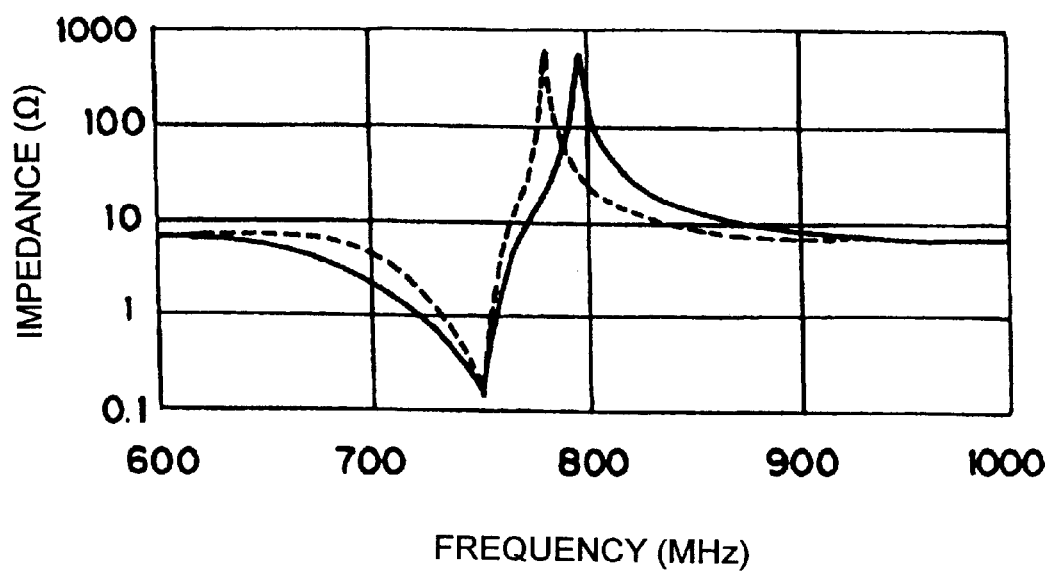
FIG. 3 shows the impedance characteristics of two surface acoustic wave resonators in which the γ values are different from each other.

FIG. 3 shows the impedance characteristics of two resonators having different $\gamma$ values. The impedance characteristic shown by a broken line in FIG. 3 is the case where the $\gamma$ value is higher, and the solid line shows the case where the $\gamma$ value is lower.

As clearly seen by comparing the impedance characteristics shown by the solid and broken lines in FIG. 3, when the other conditions are the same, it is understood that the frequency difference $\Delta f$, and other characteristics, can be made different by altering the $\gamma$ value.

Now, the attenuation pole of a surface acoustic wave filter having a lattice-type circuit construction is caused at a frequency where the lattice-arm resonators and the series-arm resonators have the same impedance as described in Japanese Unexamined Patent Application Publication No. 9-289434. That is, the attenuation pole is produced at a frequency at which the balanced condition of a lattice-type circuit is achieved.

Figure 4:
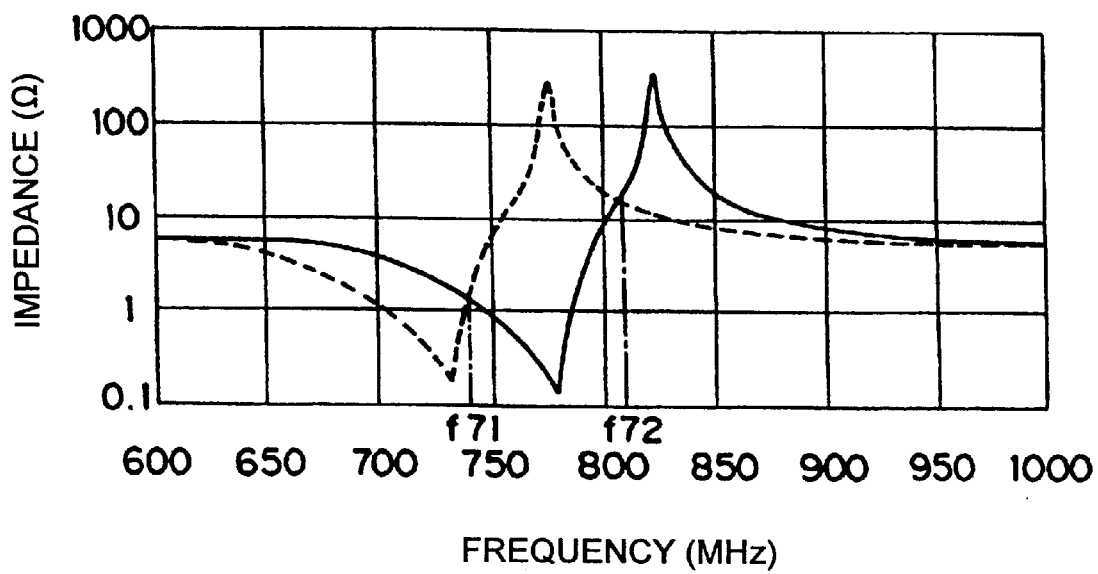
FIG. 4 shows the impedance characteristics of two surface acoustic wave resonators including a pair of terminals in which the γ values are the same and the resonant frequencies are different.

Therefore, in a surface acoustic wave filter having a lattice-type circuit construction, when the lattice-arm resonators and the series-arm resonators have the same $\gamma$ value and only the resonant frequencies are different, the impedance characteristic of each resonator is as shown in FIG. 4. That is, no attenuation pole is produced in the vicinity of the passband, and the steepness of filtering characteristics is worsened in the vicinity of the passband.

Figure 5:
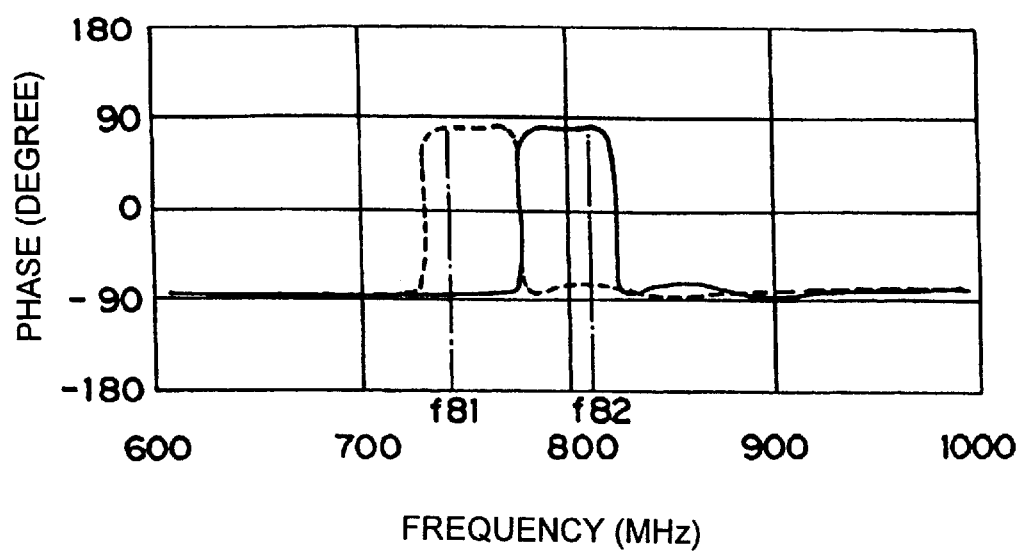
FIG. 5 shows the phase characteristics of two surface acoustic wave resonators in which the γ values are the same and the resonant frequencies are different.

Moreover, in FIG. 4, at the frequencies f71 and f72 where the impedance of the two resonators is in accord with each other, the absolute value of the impedances is the same, but, as shown in FIG. 5, the phase is different from each other, and accordingly the lattice-type circuit does not meet the balanced condition.

Figure 6:
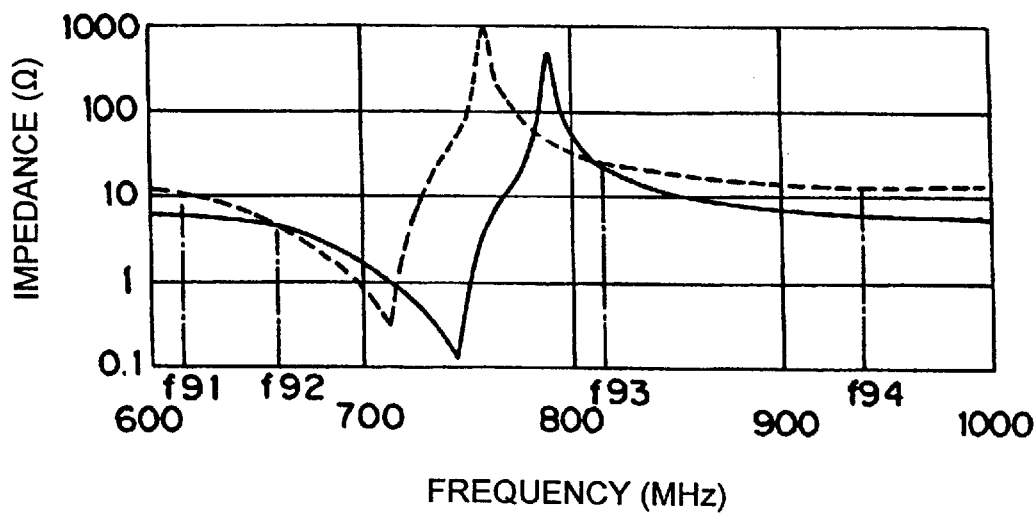
FIG. 6 shows the impedance characteristics of two surface acoustic wave resonators in which the electrode capacitance is different from each other.

On the other hand, as shown in FIG. 6, when the electrode capacitance of the lattice-arm resonators and the series-arm resonators is made different from each other, the frequencies f92 and f93 where both impedances become equal are caused and attenuation poles appear. However, in this case, at the frequencies such as f91 and f92 that are spaced away from the passband, the impedances become different and the attenuation value is deteriorated.

Then, in the present preferred embodiment, two kinds of resonators where only the $\gamma$ value is different without changing the electrode capacitance are used. Hereinafter, the construction where parallel capacitors of capacitance 10 and 11 are connected to the lattice-arm resonators 8 and 9 which is used in the present preferred embodiment is referred to as a lattice-arm resonator Z1 and the construction of the series-arm resonators 4 and 7 is referred to as a series-arm resonator Z2.

Figure 7:
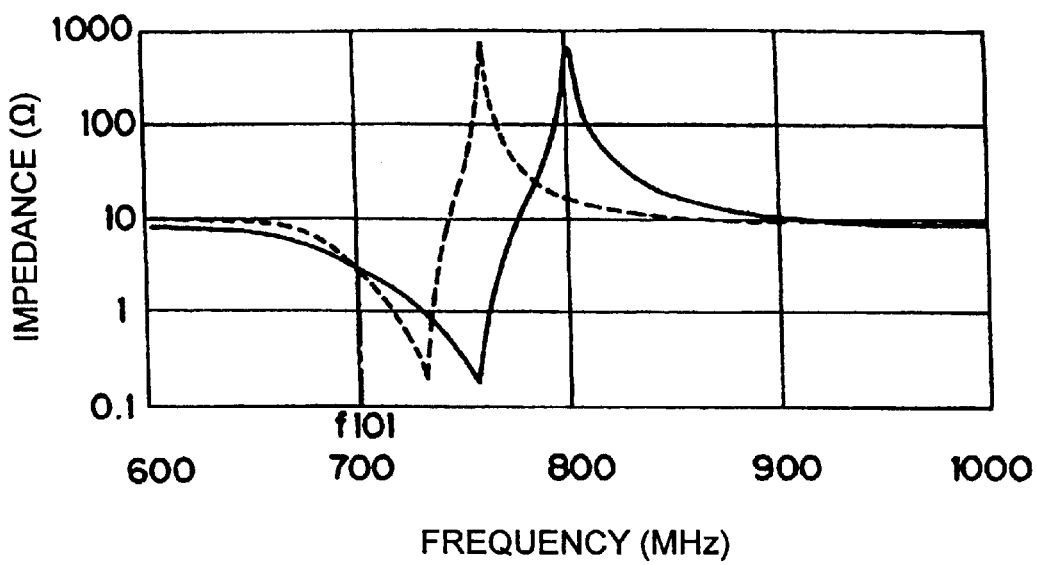
FIG. 7 shows the impedance characteristics of a surface acoustic wave resonator Z1 having a high γ value and a surface acoustic wave resonator Z2 having a low γ value.

FIG. 7 shows the impedance characteristics of the lattice-arm resonator Z1 and series-arm resonator Z2. Here, in the lattice-arm resonator Z1 and series-arm resonator Z2, only the $\gamma$ value is different from each other, and more specifically, the $\gamma$ value of the lattice-arm resonator Z1 is made larger than the $\gamma$ value of the series-arm resonator Z2 by adding the parallel capacitors, represented by capacitance 10 and 11. As clearly seen in FIG. 7, a frequency f101 where the impedances of the lattice-arm resonator Z1 and the series-arm resonator Z2 become substantially equal is newly produced.

Figure 8:
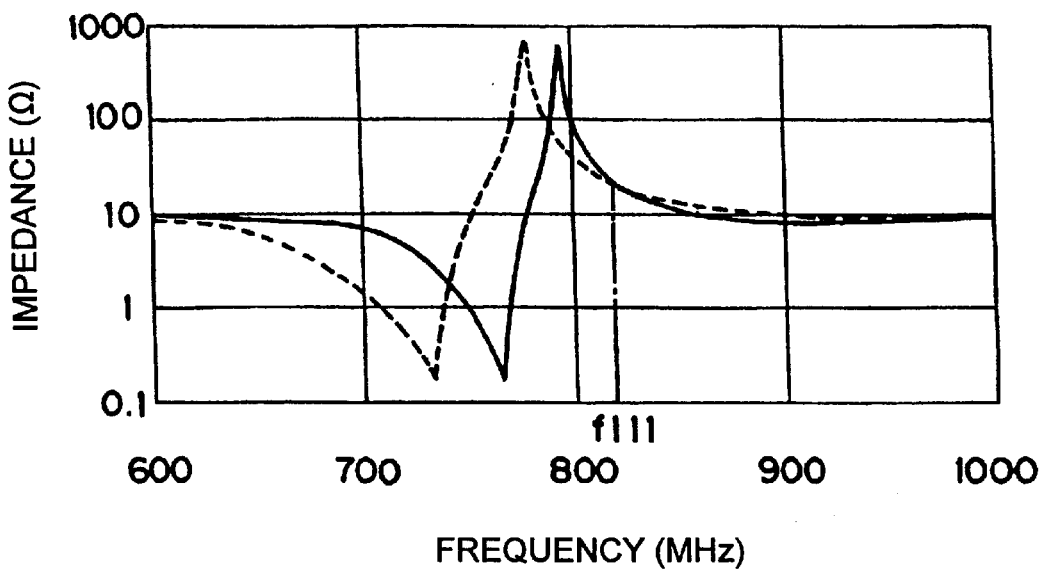
FIG. 8 shows the impedance characteristics of a surface acoustic wave resonator Z1 having a low γ value and a surface acoustic wave resonator Z2 having a high γ value.

On the contrary, when the $\gamma$ value of the series-arm resonator Z2 is made larger than the $\gamma$ value of the lattice-arm resonator Z1, as shown in FIG. 8, a frequency f111 where both impedances become substantially equal is newly produced.

Therefore, when the γ value of the lattice-arm resonator Z1 is larger than the γ value of the series-arm resonator Z2, the steepness of filtering characteristics is increased in the lower frequency region than the passband. On the contrary, when the γ value of the series-arm resonator Z2 is larger than the γ value of the lattice-arm resonator Z1, it is understood that the steepness of filtering characteristics is increased in the higher frequency region than the passband.

Furthermore, since the surface acoustic wave filter 1 of the present preferred embodiment is constructed by using a filter circuit of one stage construction as described above, the insertion loss is not increased in the passband, and the chip size is not increased either.

Next, a specific example of the first preferred embodiment of the present invention is described.

On a 36° Y-cut X-propagation $LiTaO_3$ substrate as a piezoelectric substrate (not illustrated), four surface acoustic wave resonators including a pair of terminals are constructed so as to have a circuit construction shown in FIG. 1. That is, two elements of series-arm resonators 4 and 7 and two elements of lattice-arm resonators 8 and 9 are connected so as to define a lattice-type filter circuit. The specification of the series-arm resonators 4 and 7 and lattice-arm resonators 8 and 9 is as described below.

The cross width (aperture) of electrode fingers of an IDT electrode in the series-arm resonators 4 and 7 is preferably about 55 μm, the number of pairs of electrode fingers is preferably 80, and the number of electrode fingers in the reflector on both sides is preferably 100. The cross width of electrode fingers in the lattice-arm resonators 8 and 9 is preferably about 35 μm, the number of pairs of electrode fingers is preferably 80, and the number of electrode fingers in the reflector on both sides is preferably 100.

Furthermore, in the present preferred embodiment, the capacitances 10 and 11 of parallel capacitors connected to the lattice-arm resonators 8 and 9 are about 1 pF, respectively.

The capacitors, represented by capacitance 10 and 11, are preferably constructed by disposing a pair of comb-shaped electrodes on the piezoelectric substrate. However, the electrode construction constituting parallel capacitance is not limited to the use of comb-shaped electrodes.

Moreover, the electrode capacitance of the series-arm resonators 4 and 7 is preferably about 2.8 pF, and when the above parallel capacitance is added to the electrode capacitance of the lattice-arm resonators, the added capacitance is in accord with the electrode capacitance of the series-arm resonators.

The filtering characteristic of the surface acoustic wave filter of the first preferred embodiment constructed as described above is shown in FIG. 9.

Figure 9:
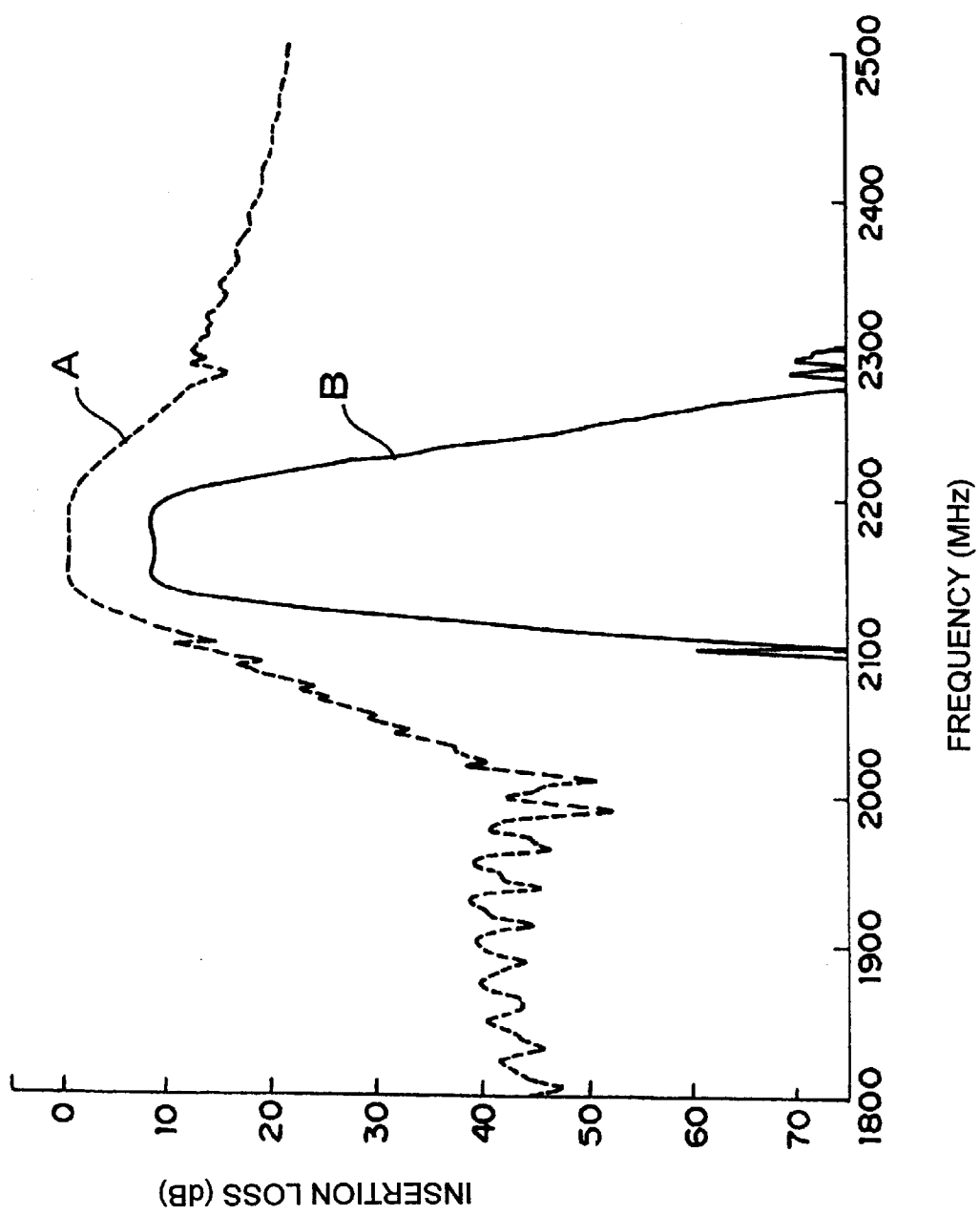
FIG. 9 shows the filtering characteristic of the surface acoustic wave filter of a first preferred embodiment of the present invention.

Moreover, a solid line B in FIG. 9 shows the filtering characteristic shown by a broken line A that has been enlarged in the vicinity of the passband by a scale shown on the right side of the vertical axis.

As clearly seen in FIG. 9, the attenuation value on the lower frequency side of the passband is considered sufficient, and accordingly it is understood that the steepness of filtering characteristics is sufficient in the vicinity of the passband.

Furthermore, in the present preferred embodiment, as the parallel capacitors, represented by the capacitance 10 and 11, are added to the lattice-arm resonators 8 and 9, the γ value is increased compared with the series-arm resonators 4 and 7 with no capacitance added. As a result, a frequency is produced to achieve a new balanced condition on the lower frequency side of the passband.

That is, in the present preferred embodiment, the parallel capacitance is added to the lattice-arm resonators and the γ value of the lattice-arm resonator is made different from the γ value of the series-arm resonator. As a result, the steepness of the filtering characteristic on the lower frequency side of the passband is increased.

Furthermore, as clearly seen in FIG. 9, the attenuation value is considered to be sufficient in the frequency region spaced away from the resonator frequency. This is because the electrode capacitances of the lattice-arm resonators 8 and 9 with the capacitance 10 and 11 added are substantially equal to the electrode capacitance of the series-arm resonators 4 and 7 in the frequency region spaced away from the resonant frequency.

Figure 10:
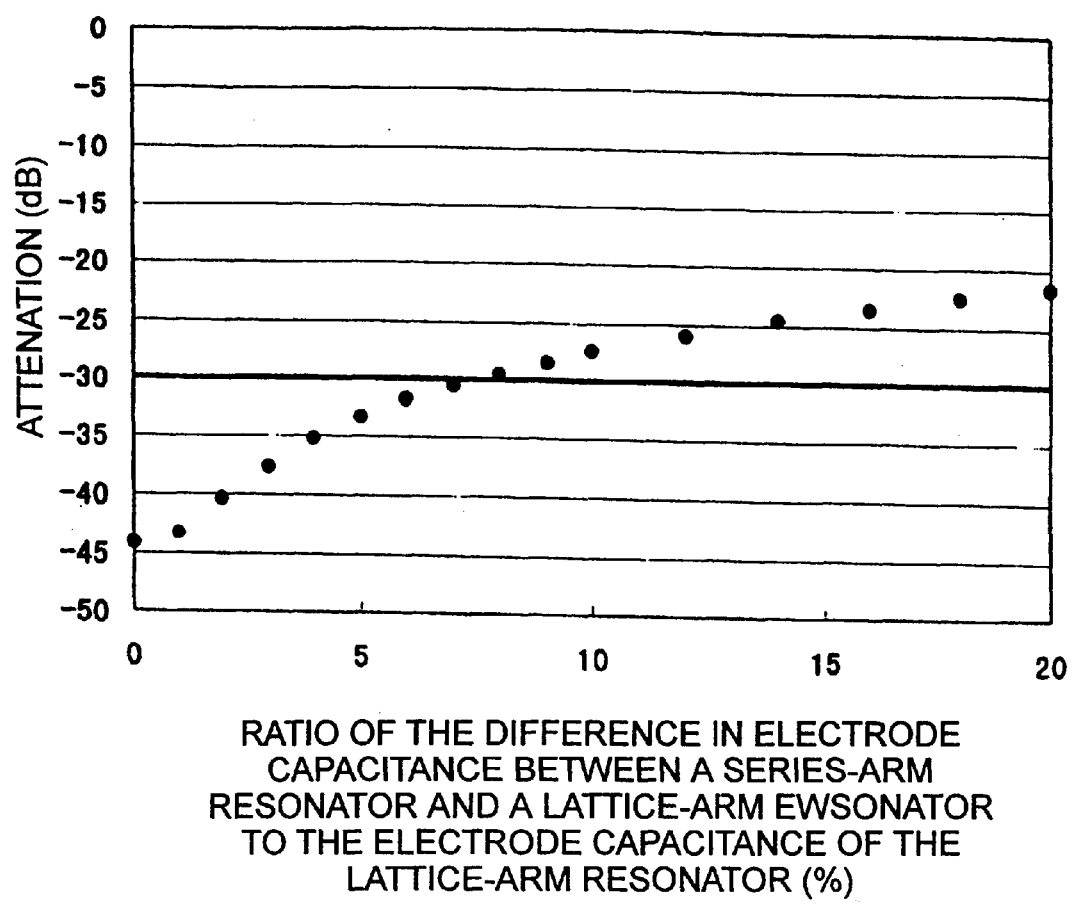
FIG. 10 shows the relationship between the difference in capacitance between series-arm resonators and lattice-arm resonators and the attenuation value outside the passband in the surface acoustic wave filter of the first preferred embodiment of the present invention.

FIG. 10 shows the relationship between the ratio (%) to the electrode capacitance of the lattice-arm resonators, of the difference in electrode capacitance of the series-arm resonators and the lattice-arm resonators including the external elements like the capacitors, represented by the capacitance 10 and 11, connected to each resonator in order to increase the capacitance and the attenuation value at a frequency spaced away from the passband, that is, at 1300MHz in the specific example of the surface acoustic wave filter according to the first preferred embodiment of the present invention. As clearly understood in FIG. 10, the larger the difference in the above-described capacitance is, the worse the attenuation value is. The higher the attenuation value outside the passband is, the better the filtering characteristic is. However, generally it is preferable that the attenuation value outside the passband is about 25 dB or more and that the attenuation value outside the passband is more preferably about 30 dB or more. Therefore, it is understood that the difference in capacitance between the series-arm resonator and the lattice-arm resonator is preferably about ±10% or less than about +10% and that the difference in capacitance between the series-arm resonator and the lattice-arm resonator is more preferably about ±5% or more than about ±5%

Figure 11:
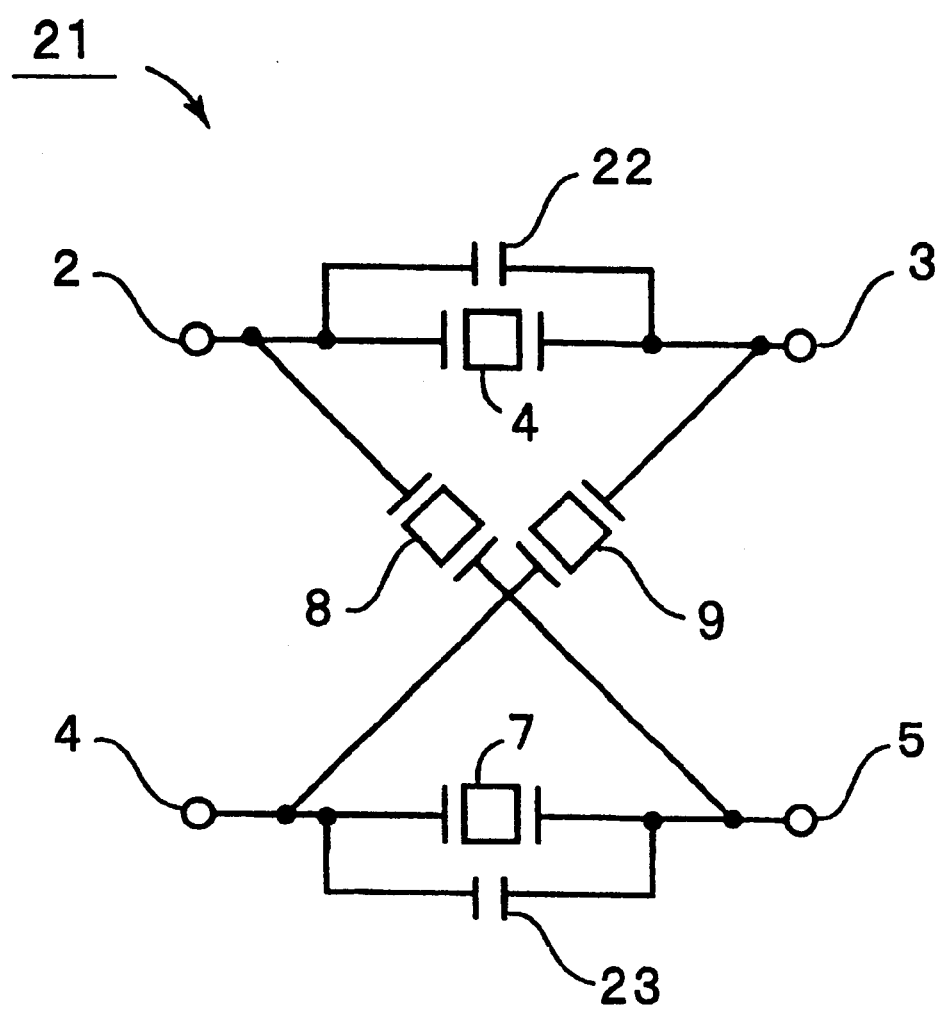
FIG. 11 shows the circuit construction of a surface acoustic wave filter of a second preferred embodiment of the present invention.

FIG. 11 shows the circuit construction of a surface acoustic wave filter according to a second preferred embodiment of the present invention. In the surface acoustic wave filter 21 of the second preferred embodiment, parallel capacitors, represented by capacitances 22 and 23, are added to series-arm resonators 4 and 7, and parallel capacitors are not added to lattice-arm resonators 8 and 9. As the other construction is similar to that of the first preferred embodiment, by giving the same reference numeral to the same portion and by quoting the description of the first preferred embodiment, its description is omitted.

By describing a specific example of the surface acoustic wave filter 21 of the second preferred embodiment together with the filtering characteristics, the effect of the second preferred embodiment will be made clear.

The specification of the series-arm resonators 4 and 7 and the lattice-arm resonators 8 and 9 is as described below.

The cross width of electrode fingers of an IDT electrode in the series-arm resonators 4 and 7 is preferably about 35 μm, and the number of pairs of electrode fingers was preferably 80. Furthermore, the number of electrode fingers of the resonator was preferably 100.

On the other hand, the cross width of electrode fingers of an IDT electrode in the lattice-arm resonators 8 and 9 was about 55 μm, the number of pairs of electrode fingers was preferably 80, and the number of electrode fingers of the resonator was preferably 100.

Furthermore, the value of capacitance of the above-described added parallel capacitors, represented by capacitance 22 and 23, was about 1 pF. The added parallel capacitors, represented by capacitances 22 and 23, were constructed by disposing a pair of comb-shaped electrodes on the piezoelectric substrate.

Moreover, the electrode capacitance of the surface acoustic wave resonators themselves constituting the series-arm resonators 4 and 7 is about 1.8 pF, and the electrode capacitance of the surface acoustic wave resonators themselves constituting the lattice-arm resonators 8 and 9 is about 2.8 pF. Therefore, when the capacitance 1 pF which was added by the above-described added parallel capacitors, represented by capacitance 22 and 23, is added to the electrode capacitance of the series-arm resonators 4 and 7, the added electrode capacitance agrees with the electrode capacitance of the lattice-arm resonators 8 and 9.

Figure 12:
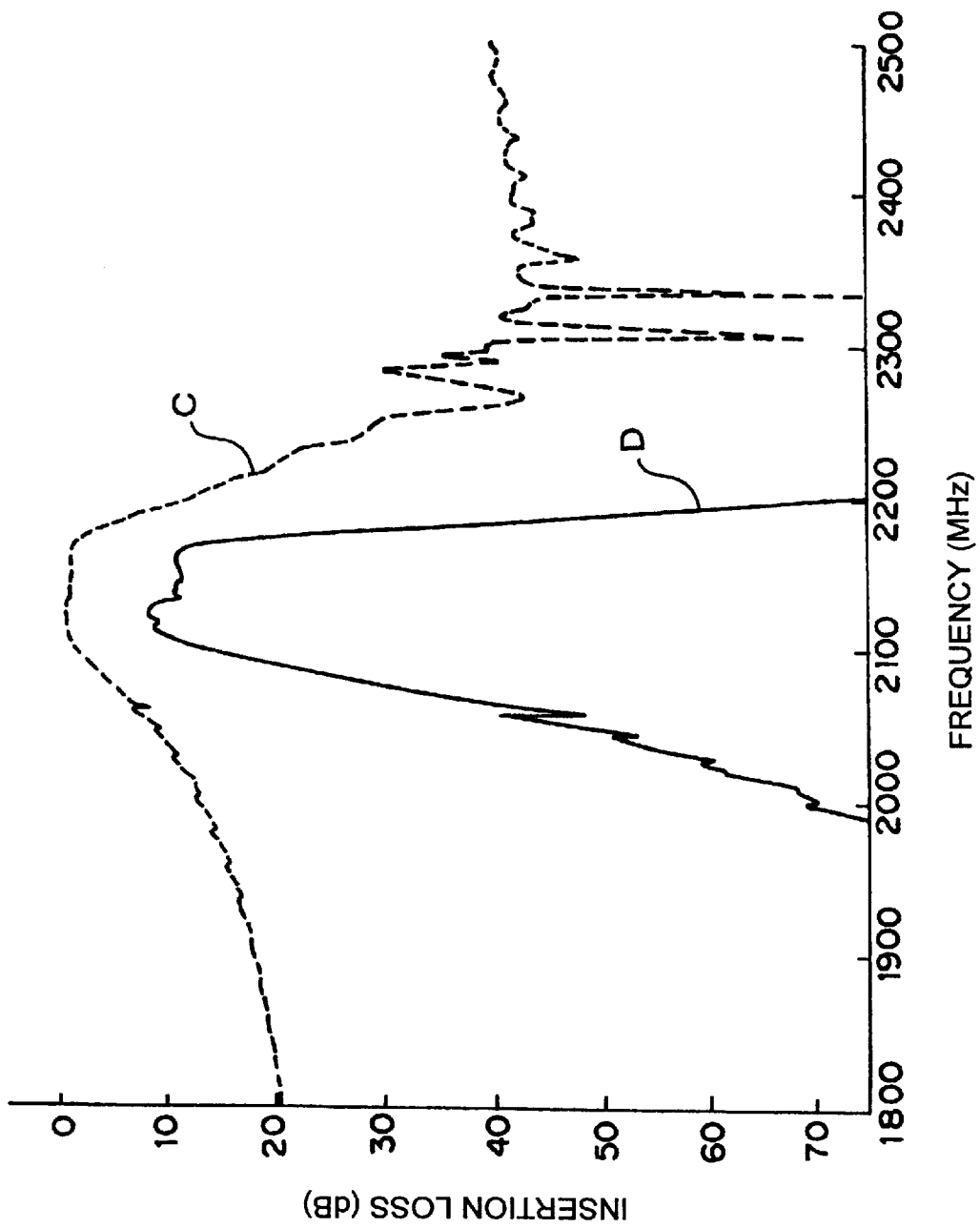
FIG. 12 shows the filtering characteristic of the surface acoustic wave filter of the second preferred embodiment of the present invention.

FIG. 12 shows the filtering characteristic of the second preferred embodiment constructed as described above. A solid line in FIG. 12 is the essential portion of the filtering characteristic shown by a broken line C where the value of insertion loss of the vertical axis is enlarged in accordance with the scale shown on the right side of the vertical axis.

As clearly seen in FIG. 12, because the γ value of the series-arm resonators where the capacitors, represented by capacitances 22 and 23, are added to the series-arm resonators 4 and 7 becomes larger than the γ value of the lattice-arm resonators 8 and 9, frequencies meeting the balance condition are newly produced on the higher frequency side of the passband. Therefore, as shown in FIG. 12, the steepness of filtering characteristics on the higher frequency side of the passband is increased.

Furthermore, because the electrode capacitances of the series-arm and lattice-arm resonators are substantially equal to each other in the frequency region spaced away from the resonant frequency, it is understood that the attenuation value is high enough in the frequency region spaced away from the passband.

Figure 13:
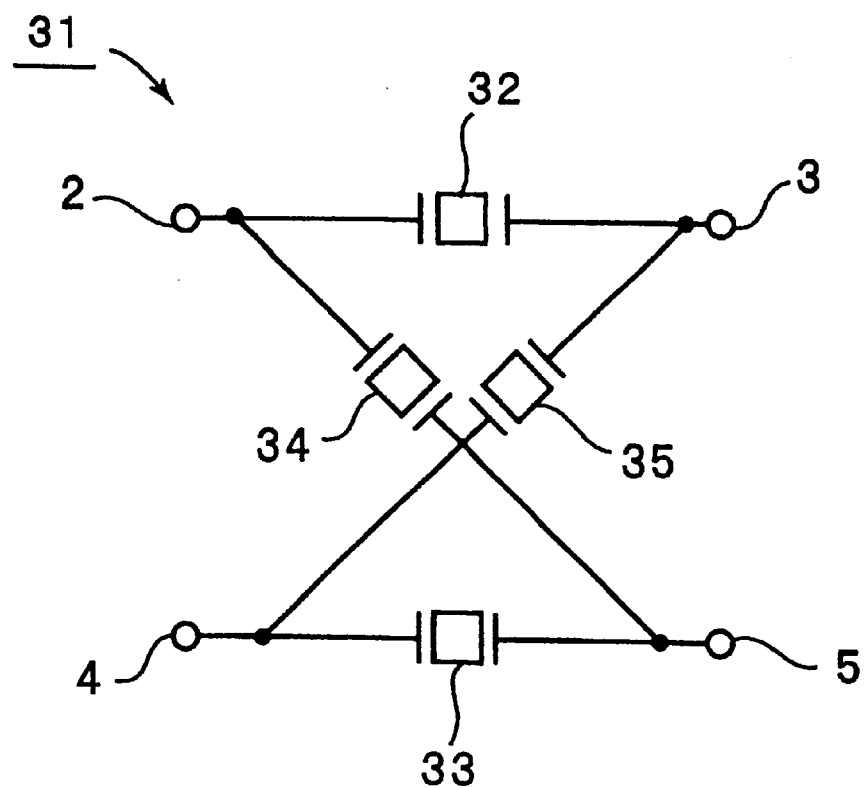
FIG. 13 shows the circuit construction of a surface acoustic wave filter of a third preferred embodiment of the present invention.

FIG. 13 shows the circuit construction of a surface acoustic wave filter of a third preferred embodiment. In the surface acoustic wave filter 31 of the third preferred embodiment, no capacitors are added to any of series-arm resonators and lattice-arm resonators.

No additional capacitors are connected to any of the series-arm resonators 32 and 33 and lattice-arm resonators 34 and 35.

In the present preferred embodiment, in such a way that in an IDT electrode of the lattice-arm resonators 34 and 35 the electrode fingers are thinned out and dummy electrodes are disposed in the thinned electrode fingers, the γ value of the lattice-arm resonators 34 and 35 is made higher.

Based on a more specific example, the detail of the third preferred embodiment is made clear.

The specification of a surface acoustic wave resonator constituting the series-arm resonators 32 and 33 is as described below.

The cross width of electrode fingers of an IDT electrode is preferably about 55 μm, the number of pairs of electrode fingers is preferably 80, and the number of electrode fingers of the reflector is preferably 100. The cross width of electrode fingers of an IDT electrode in the lattice-arm resonators 34 and 35 is preferably about 55 μm, the number of pairs of electrode fingers is preferably 80, and the number of electrode fingers in the reflector is preferably 100.

Figure 14:
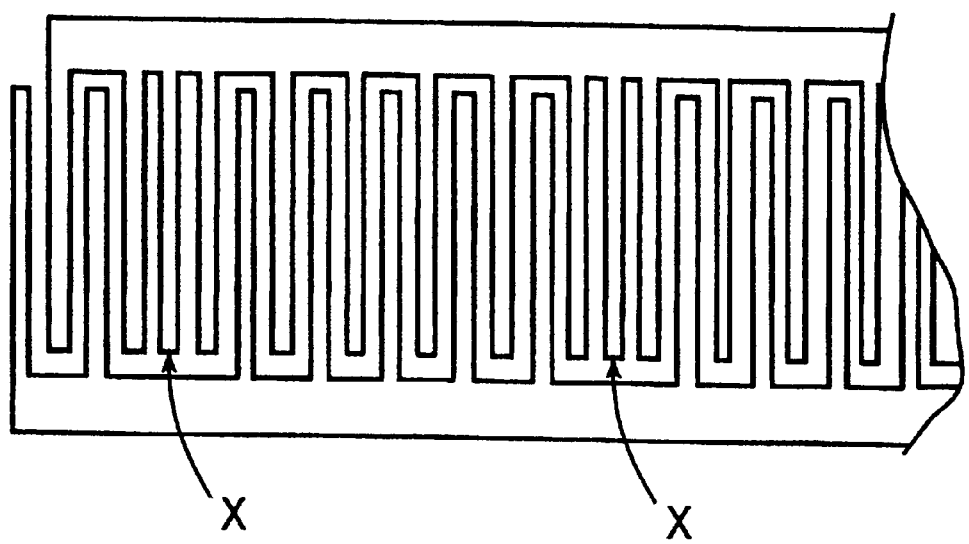
FIG. 14 is a partial cutaway top view for describing an IDT electrode included in the third preferred embodiment in which the withdrawal weighting is performed.

In the IDT electrode of the lattice-arm resonators 34 and 35, one third of the total electrode fingers are thinned out and dummy electrodes are disposed in the thinned-out portion. This is enlarged and shown in FIG. 14. FIG. 14 is a partial cutaway top view showing the enlarged essential portion of the IDT electrode of the lattice-arm resonators, and here dummy electrodes X are disposed at the locations where the electrode fingers are thinned out. By the withdrawal of electrode fingers the γ value of the lattice-arm resonators 34 and 35 is made higher.

However, when the electrode fingers are thinned out according to a certain rule in such a way that one of three electrode fingers is thinned out in order, ripples are caused at specific frequencies. Accordingly, in the present preferred embodiment, the above withdrawal weighting is performed at random.

Moreover, the number of pairs of electrode fingers of the IDT electrode in the lattice-arm resonators, that is, 80 pairs excludes the thinned-out electrode fingers. Accordingly, the electrode capacitance of the lattice-arm resonators 34 and 35 is nearly in accord with the electrode capacitance of the series-arm resonators 32 and 33.

Figure 15:
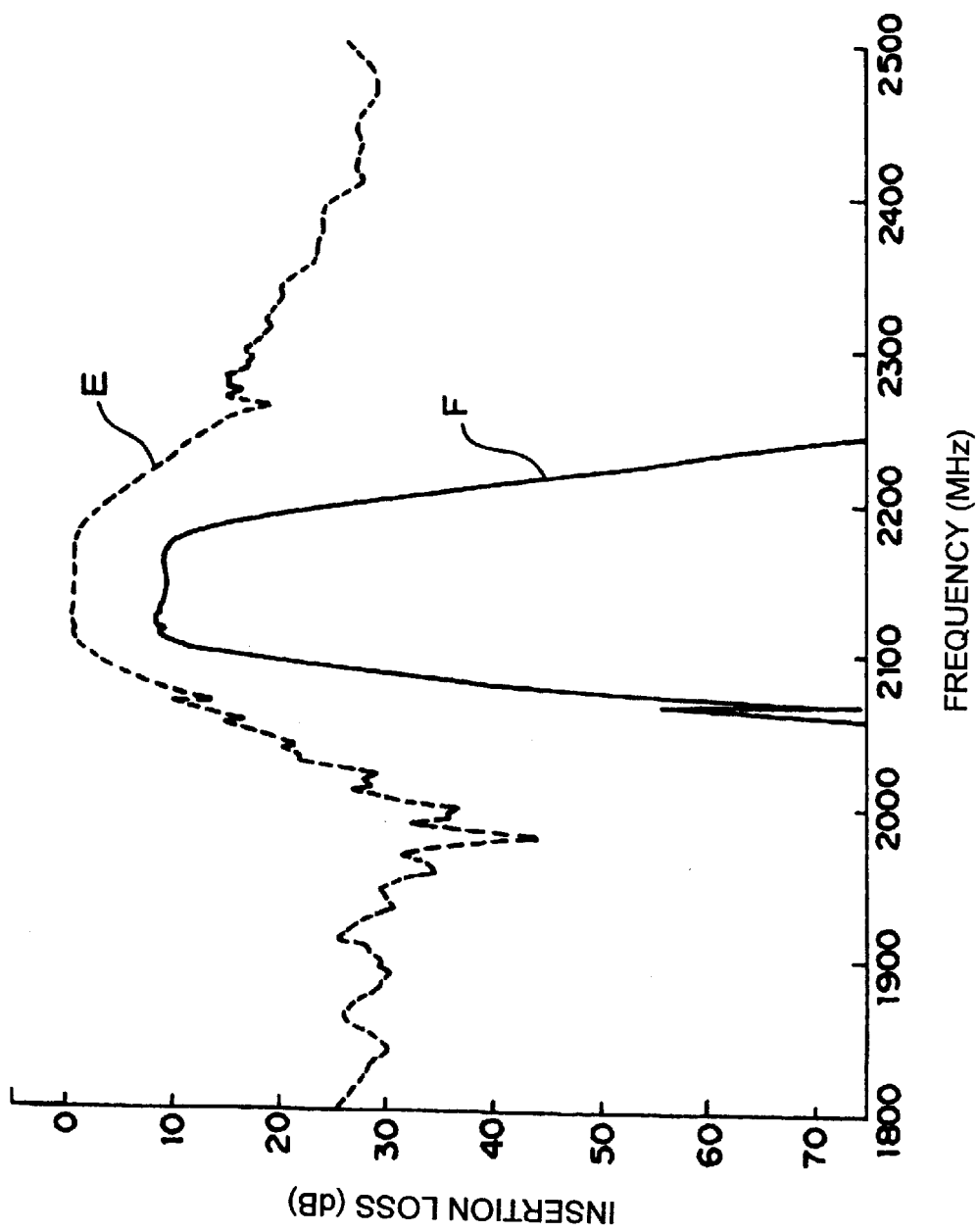
FIG. 15 shows the filtering characteristic of the surface acoustic wave filter of the third preferred embodiment.
Figure 16:
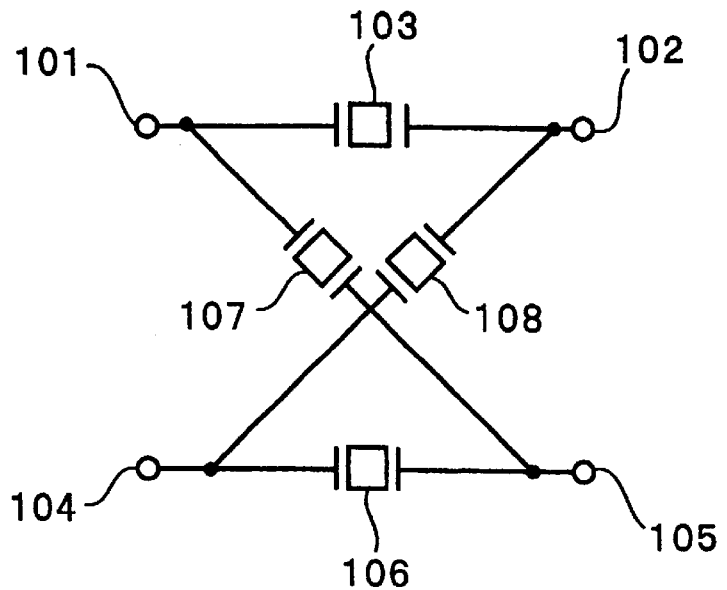
FIG. 16 shows the circuit construction of a conventional lattice-type surface acoustic wave filter.
Figure 17:
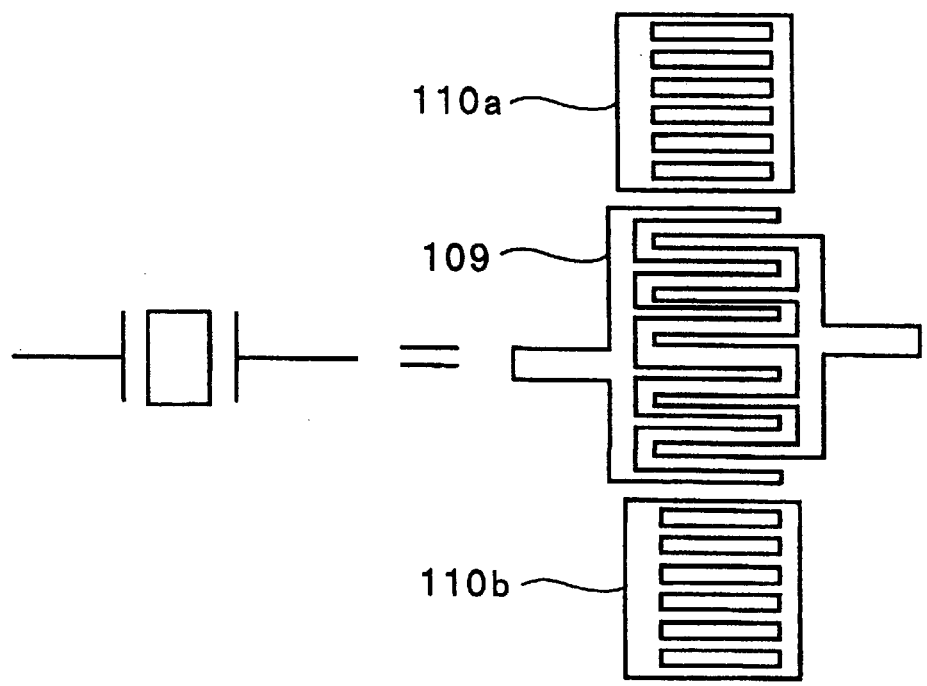
FIG. 17 is a schematic top view showing the electrode construction of a surface acoustic wave resonator.
Figure 18:
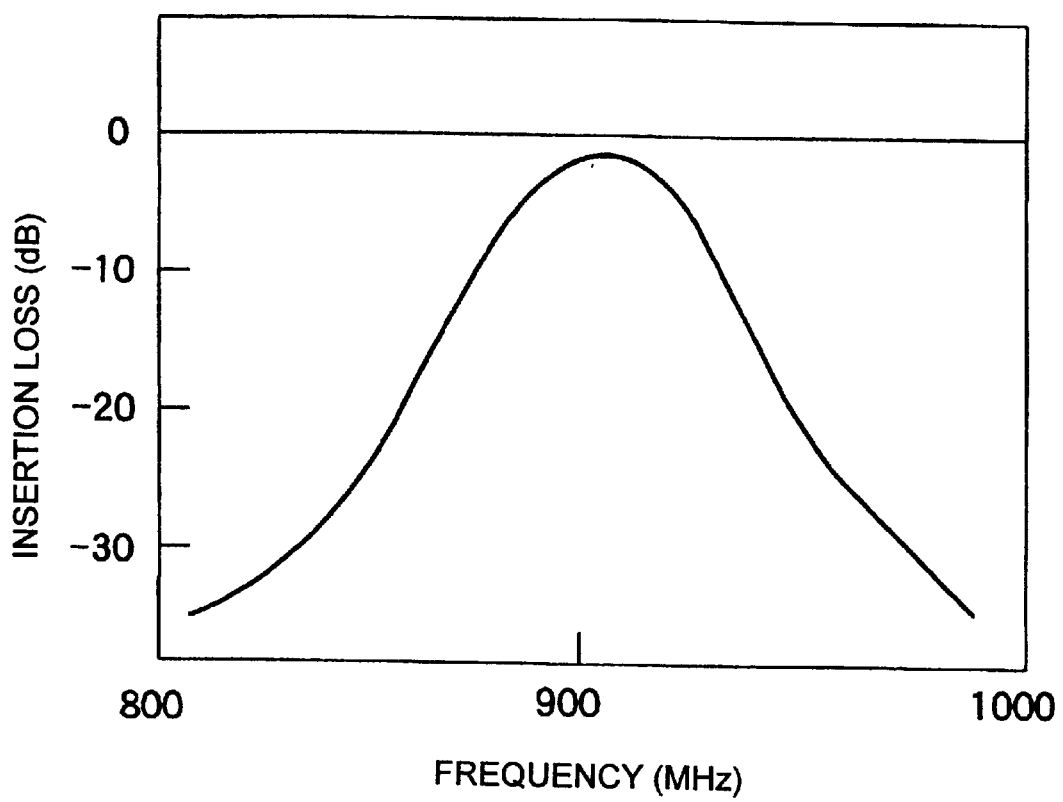
FIG. 18 shows one example of filtering characteristics of the conventional lattice-type surface acoustic wave filter.
Figure 19:
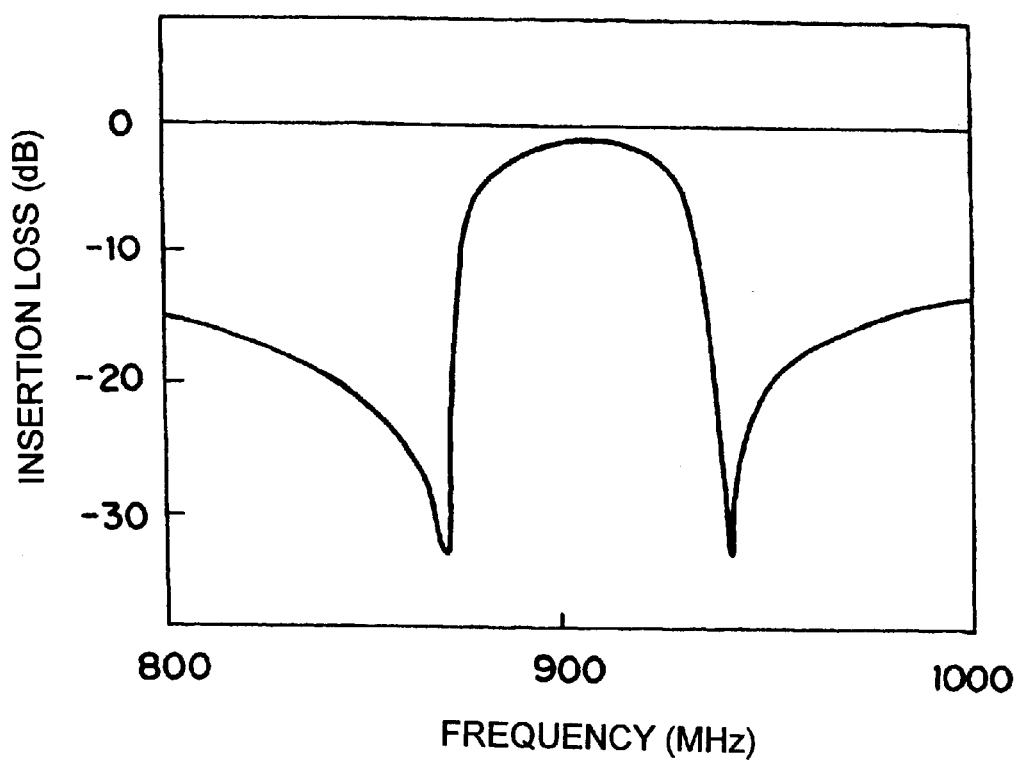
FIG. 19 shows the filtering characteristic of a conventional lattice-type surface acoustic wave filter in which the capacitance ratio of lattice-arm resonators and series-arm resonators is made different from each other.

FIG. 15 shows the filtering characteristic of the surface acoustic wave filter of the third preferred embodiment. In FIG. 15, a solid line F shows the characteristic where the essential portion of the filtering characteristic shown by a broken line E is enlarged in accordance with the scale shown on the right side of the vertical axis.

As clearly seen in FIG. 15, the steepness of filtering characteristics on the lower frequency side of the passband is increased in the same way as in the first preferred embodiment. This is because by withdrawal weighting the electrode fingers of the IDT electrode of the lattice-arm resonators 34 and 35, the γ value of the lattice-arm resonators 34 and 35 is made higher than the γ value of the series-arm resonators 32 and 33 and by the withdrawal weighting the frequencies meeting a new balanced condition is produced on the lower frequency side of the passband. Accordingly, an attenuation pole is formed on the lower frequency side of the passband and the steepness of the filtering characteristic is greatly increased.

In the present preferred embodiment, the above withdrawal weighting was performed in the lattice-arm resonators 34 and 35 and the steepness of filtering characteristics was increased on the lower frequency side of the passband, but, on the contrary, when the withdrawal weighting is performed in the series-arm resonators 32 and 33 as described above, the steepness is increased on the higher frequency side of the passband.

Figure 20:
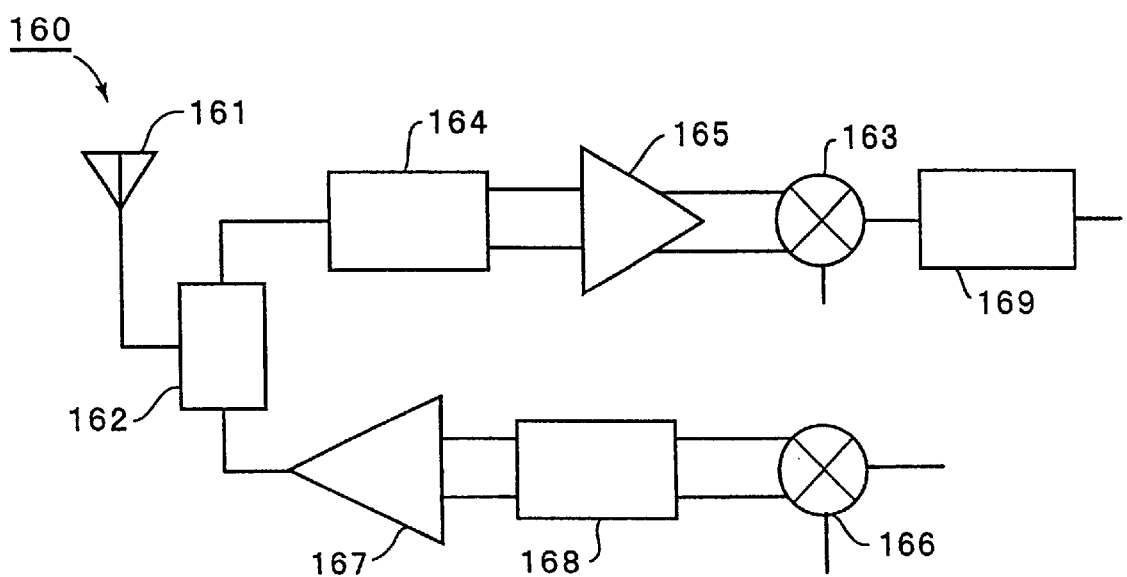
FIG. 20 is a block diagram showing in part a communication device in which a surface acoustic wave filter according a preferred embodiment of the present invention is used.

The surface acoustic wave filters according to first to third preferred embodiments can be successfully applied to a communication device such as a cellular phone. FIG. 20 is a block diagram showing a portion of a communication device 160. In the communication device 160, an antenna 161 is connected to a duplexer 162. The duplexer 162 is connected to an amplifier 167 and a surface acoustic wave filter 164. The amplifier 167 is connected to a transmitting side mixer 166 through a RF stage surface acoustic wave filter 168. The surface acoustic wave filter 164 is connected to an amplifier 165 which is connected to an IF stage filter through a mixer 163.

The surface acoustic wave filter according to the first to third preferred embodiments of the present can suitably used for the RF stage surface acoustic wave filter 168 in the communication device 160.

As clearly understood from the first to third preferred embodiments, as a method for making the γ value of lattice arms and series arms different, excluding a method for making the capacitance ratio of a surface acoustic wave resonator constituting each of lattice-arm resonators and series-arm resonators different, various methods of adding parallel capacitors, withdrawal weighting electrode fingers of IDT electrodes, and other suitable methods, can be used as described above.

Furthermore, in the first to third preferred embodiment, the examples using a 36° Y-cut X-propagation $LiTaO_3$ substrate were shown, but other piezoelectric substrates may be used.

Moreover, the number of electrode fingers of the reflector in the surface acoustic wave resonators of a pair of terminals constituting the series-arm resonators and lattice-arm resonators was preferably 100 in the specific examples of the first to third preferred embodiments described herein, but the number of electrode fingers is not limited to this.

As for the cross width and the number of pairs of electrode fingers of the IDT electrodes constructed to show the specific filtering characteristics in the first to third preferred embodiments, they are not limited to the above examples.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:
   a piezoelectric substrate; and
   a plurality of surface acoustic wave resonators disposed on the piezoelectric substrate;
   wherein the plurality of surface acoustic wave resonators are connected so as to constitute a lattice-type circuit having series arm resonators and lattice arm resonators, and a capacitance ratio $\gamma$ value of the lattice arm resonators and a capacitance ratio $\gamma$ value of the series arm resonators are different from each other.

2. A surface acoustic wave filter as claimed in claim 1, wherein parallel capacitors are connected in parallel across at least one of the lattice arm resonators and the series arm resonators so that the $\gamma$ values of the lattice arm resonators and the series arm resonators are different from each other.

3. A surface acoustic wave filter as claimed in claim 1, wherein each of the surface acoustic wave resonators comprises an IDT electrode, and the IDT electrode of at least one of the lattice arm resonators and the series arm resonators is withdrawn weighted so that the $\gamma$ values of the lattice arm resonator and the series arm resonator are different from each other.

4. A surface acoustic wave filter as claimed in claim 1, wherein the difference in electrode capacitance between at least one of the series arm resonators and at least one of the lattice arm resonators including an external element connected to each resonator is within about ±10% of the electrode capacitance of the at least one of the lattice arm resonators.

5. A surface acoustic wave filter as claimed in claim 4, wherein the difference in electrode capacitance between the at least one of the series arm resonators and the at least one of the lattice arm resonators is within about ±5% of the electrode capacitance of the at least one of the lattice arm resonators.

6. A surface acoustic wave filter as claimed in claim 1, wherein the series arm resonators are disposed between signal terminals.

7. A surface acoustic wave filter as claimed in claim 1, wherein the lattice arm resonators are disposed between signal terminals.

8. A surface acoustic wave filter as claimed in claim 1, wherein at least one of said plurality of surface acoustic wave resonators includes an input terminal, an output terminal, and between the input terminal and the output terminal, an equivalent inductance, an equivalent capacitance, and an equivalent resistance connected in series, and an equivalent parallel capacitance is connected to the equivalent inductance, equivalent capacitance, and equivalent resistance.

9. A surface acoustic wave filter as claimed in claim 1, wherein the electrode capacitance of each of the lattice-arm resonators and each of the series arm resonators is different from each other.

10. A surface acoustic wave filter as claimed in claim 1, wherein the $\gamma$ value of each of the lattice arm resonators is larger than the $\gamma$ value of each of the series arm resonators.

11. A surface acoustic wave filter as claimed in claim 1, wherein the $\gamma$ value of each of the series arm resonators is larger than the $\gamma$ value of each of the lattice arm resonators.

12. A surface acoustic wave filter as claimed in claim 1, further comprising parallel capacitors provided in the series arm resonators.

13. A surface acoustic wave filter as claimed in claim 1, wherein the series arm resonators and the lattice arm resonators do not have parallel capacitors.

14. A communication device comprising:
    at least one surface acoustic wave filter including:
      a piezoelectric substrate; and
      a plurality of surface acoustic wave resonators disposed on the piezoelectric substrate;
      wherein the plurality of surface acoustic wave resonators are connected so as to constitute a lattice-type circuit having series-arm resonators and lattice-arm resonators, and a capacitance ratio $\gamma$ value of the lattice-arm resonators and a capacitance ratio $\gamma$ value of the series-arm resonators are different from each other.

15. A communication device according to claim 14, further comprising an antenna, a duplexer, an amplifier, a transmitting side mixer, wherein the antenna is connected to the duplexer, the duplexer is connected to the amplifier and the at least one surface acoustic wave filter.

16. A communication device according to claim 14, wherein parallel capacitors are connected in parallel across at least one of the lattice arm resonators and the series arm resonators so that the $\gamma$ values of the lattice arm resonators and the series arm resonators are different from each other.

17. A communication device according to claim 14, wherein each of the surface acoustic wave resonators comprises an IDT electrode, and the IDT electrode of at least one of the lattice arm resonators and the series arm resonators is withdrawn weighted so that the $\gamma$ values of the lattice arm resonator and the series arm resonator are different from each other.

18. A communication device according to claim 14, wherein the difference in electrode capacitance between at least one of the series arm resonators and at least one of the lattice arm resonators including an external element connected to each resonator is within about ±10% of the electrode capacitance of the at least one of the lattice arm resonators.

19. A communication device according to claim 14, wherein the difference in electrode capacitance between the at least one of the series arm resonators and the at least one of the lattice arm resonators is within about ±5% of the electrode capacitance of the at least one of the lattice arm resonators.

20. A communication device according to claim 14, wherein the electrode capacitance of each of the lattice-arm resonators and each of the series arm resonators is different from each other.

21. A communication device according to claim 14, wherein the γ value of each of the lattice arm resonators is larger than the γ value of each of the series arm resonators.

22. A communication device according to claim 14, wherein the γ value of each of the series arm resonators is larger than the γ value of each of the lattice arm resonators.

* * * * *